United States Patent [19]

Thornton et al.

[11] Patent Number: 4,706,255
[45] Date of Patent: Nov. 10, 1987

[54] PHASED ARRAY SEMICONDUCTOR LASER WITH PREFERRED EMISSION IN THE FUNDAMENTAL SUPERMODE

[75] Inventors: Robert L. Thornton, East Palo Alto; Robert D. Burnham, Palo Alto, both of Calif.

[73] Assignee: Xerox Corporation, Stamford, Conn.

[21] Appl. No.: 736,040

[22] Filed: May 20, 1985

[51] Int. Cl.$^4$ .............................................. H01S 3/19
[52] U.S. Cl. ...................................... 372/50; 372/45; 372/46
[58] Field of Search .............................. 372/50, 45, 46

[56] References Cited

U.S. PATENT DOCUMENTS

| | | | |
|---|---|---|---|
| Re. 31,806 | 1/1985 | Scifres et al. | 372/50 |
| 4,331,938 | 5/1982 | Limm et al. | 372/50 |
| 4,371,968 | 2/1983 | Trussell, Jr. et al. | 372/50 |
| 4,385,389 | 5/1983 | Botez | 372/50 |
| 4,594,719 | 6/1986 | Ackley | 372/50 |

OTHER PUBLICATIONS

W. Streifer et al., "Phased Array Diode Lasers", Laser Focus/Electro-Optics, Jun. 1984.
J. Katz et al., "Supermode Discrimination in Phased--Locked Arrays of Semiconductor Lasers", IEEE International Semiconductor Conference in Brazil, Jul. 1984.
TWU et al., "High Power Coupled Ridge Waveguide Semiconductor Laser Arrays", APL vol. 45(7), pp. 709–711 (Oct. 1, 1984).
S. Mukai et al., "Fundamental Mode Oscillation . . . Laser Array", APL, vol. 45(8), pp. 834–835 (Oct. 15, 1984).

Primary Examiner—James W. Davie
Attorney, Agent, or Firm—W. Douglas Carothers, Jr.

[57] ABSTRACT

A phased array semiconductor lasers provides fundamental or preferred 1$^{st}$ supermode operation wherein laser fabrication is carried out via a single, continuous fabricating process followed by impurity induced disordering (IID). Fundamental supermode selection is accomplished by providing a multiquantum well superlattice as a cladding layer in the phased array laser structure in combination with the conventional single semiconductor cladding layer, which is followed by spatially disposed impurity induced disordering regions extending through the superlattice to form spatially formed regions capable of providing higher gain compared to adjacent regions not experiencing impurity induced disordering. The adjacent regions without impurity induced disordering contain unspoiled superlattice regions that provide higher real index waveguiding compared to the adjacent disordered regions with the diffusions in the disordered regions have higher conductivity properties compared to the remaining ordered regions and are, therefore, more efficiently pumped electrically. As a result, disordered regions form alternating higher gain regions offset between regions of nondisordered waveguide regions having higher real index waveguiding properties but lower gain properties, thereby fulfilling the conditions necessary to provide fundamental or preferred 1$^{st}$ supermode operation.

16 Claims, 3 Drawing Figures

PHASED ARRAY SEMICONDUCTOR LASER WITH PREFERRED EMISSION IN THE FUNDAMENTAL SUPERMODE

BACKGROUND OF THE INVENTION

This invention relates to phased array semiconductor lasers having multi-emission or broad emission capabilities and in particular to a phased array laser or phased locked array laser having preferred fundamental supermode operation with a structural design tht utilizes impurity induced disordering (IID).

Phased array semiconductor lasers comprise a plurality of closely coupled or spaced emitters on the same integral structure or substrate. Examples of such phased array lasers are illustrated in U.S. Pat. No. 4,255,717, now Pat. No. Re. 31,806, and in an article of William Streifer et al., entitled "Phased Array Diode Lasers", published in the June 1984 Issue of Laser Focus/Electro-Optics. The emitters of such a laser are represented by the periodically spaced current confinement means, e.g. stripes, for current pumping and establishment of spaced optical cavities in the active region of the structure. The current confinement means may be interconnected or closely spaced to a degree that the optical mode established in each of the lasing cavities below a respective current confinement means couples to its neighboring optical modes, i.e., the evanescent wave overlaps into adjacent optical lasing cavities. The array of optical fields produced become locked in phase, and, if the phase difference between adjacent current confinement means is zero, the lateral radiation pattern in the far field will comprise a single lobe. However, as explained in the above-mentioned article, the phased array laser does not operate in a single mode but rather generally operate with two or more lobes in the far field pattern. The phase relationship between adjacent optical modes is not under independent control and the phases will adjust themselves in a manner toward minimizing laser threshold current. In most cases, it appears that the lasing mode favored is a supermode wherein the optical field between adjacent optical emitters passes through zero. This is because in most real refractive index lasers as well as many gain guided lasers, pumping is reduced at locations between the laser emitters requiring overall reduced current pumping.

The foregoing explanation can be exemplified as follows. An array laser with N coupled emitters has N possible coupled modes, which are referred to as "supermodes". A supermode is a cooperative lasing of the N optical emitters or filaments of the array laser. Since there are N emitters, there are N possible supermodes since all these emitters are optically coupled together.

Each supermode has the property that the $1^{st}$ and the $N^{th}$ supermode have the same intensity pattern or envelope, the $2^{nd}$ and the $(N-1)^{th}$ have the same intensity envelope, and, in general, the $i^{th}$ and $(N-i)^{th}$ have the same intensity envelopes. The $1^{st}$ or fundamental supermode has all emitters lasing in phase with an amplitude distribution representative of half a sinusoidal cycle. This is the only supermode pattern that radiates in a single central lobe in the far field pattern because all emitters are in phase.

Thus, for a uniformly spaced array of identical emitters, the $1^{st}$ and $N^{th}$ supermode envelopes are half a sinusoidal period, the second and the $(N-1)^{th}$ supermode envelopes are two half sinusoidal periods, etc. The phase relationship between the individual emitters in N supermodes differ. Specifically, for the $1^{st}$ supermode, all emitters are in phase and for the $N^{th}$ supermode, the phases alternate between zero and $\pi$. Usually the $1^{st}$ and $N^{th}$ supermodes have the lowest current thresholds as compared to all other supermodes because their intensity envelopes do not exhibit nulls near the center of the array where the charge density is greater as a result of current spreading and charge diffusion in the active region of the array laser. However, as previously indicated, the $N^{th}$ supermode, which radiates in two lobes, has a lower current threshold of operation than the $1^{st}$ supermode.

Phased array lasers have high utility due to their high power output. It is preferred that the power be concentrated in a single lobe, i.e., in the $1^{st}$ supermode. The reason is that a substantial majority of laser applications require power in a single far field lobe. If lasing is experienced in more than one lobe, measures are taken to diminish or otherwise attempt to eliminate or block off the other operating lobes in the far field pattern.

Recently, there has been much activity relative to phase locked array lasers or phased array lasers where efforts have been established to discriminate among the supermodes and provide fundamental supermode selection. One such suggestion was at the IEEE 9th Conference in Brazil, July, 1984 wherein J. Katz et al presented a talk on supermode discrimination by controlling lateral gain distribution along the plane of the lasing elements by incorporating a separate contact to each laser array element and tailoring the currents through the array laser elements. The abstract for the talk is found in the Proceedings of the Conference at pages 94 and 95 entitled "Supermode Discrimination in Phase-Locked Arrays of Semiconductor Laser Arrays".

More recently is the articles of Twu et al entitled "High Power Coupled Ridge Waveguide Semiconductor Laser Arrays", Applied Physics Letters, Vol. 45(7), pp. 709–711 (Oct. 1, 1984) and of S. Mukai et al entitled Fundamental Mode Oscillation of Buried Rdge Waveguide Laser Array", Applied Physics Letters, Vol. 45(8), pp. 834–835 (Oct. 15, 1984). These articles suggest discrimination among the supermodes to obtain the single lobe fundamental supermode by employing index guided ridge waveguide structure wherein the laser elements are uniformly pumped with the optical field mainly confined to the ridge region of the structure while higher gain is experienced in the valley or coupling regions to induce in-phase operation (0° phase) and promotion of fundamental supermode operation. Further techniques to discriminate among supermodes are illustrated in U.S. patent application Ser. No. 667,251 filed Nov. 1, 1984, U.S. Pat. No. 4,624,000, entitled "Phased Array Semiconductor Lasers With Preferred Emission in a Single Lobe" and assigned to the same assignee herein. The techniques proposed in this application relate to the use of structural means associated with the laser to enhance the amount of gain experienced in regions between adjacent optical cavities of lasing elements by spatially modulating the optical overlap of the optical field of each of the laser elements across the array to thereby favor the fundamental supermode over other potential modes.

The present invention represents an improved phased array semiconductor laser providing the desired fundamental supermode operation but utilizing a more streamline structural configuration providing a much simpler method of fabrication by employing Impurity Induced Disordering (IID) techniques.

SUMMARY OF THE INVENTION

According to this invention, phased array semiconductor lasers provide fundamental or preferred $1^{st}$ supermode operation wherein fabrication is accomplished by a single, continuous fabrication process followed by impurity induced disordering (IID), e.g. the impurity diffusion technique or the implant/anneal technique as known in the art. Fundamental supermode selection is accomplished by providing a multiquantum well superlattice as a cladding layer in the phased array laser structure in combination with the conventional single semiconductor cladding layer, which is followed by spatially disposed impurity induced disordering regions extending through the superlattice to form spatially formed regions capable of providing higher gain compared to adjacent regions not experiencing impurity induced disordering. The adjacent regions without impurity induced disordering contain unspoiled superlattice regions that provide higher real index waveguiding compared to the adjacent disordered regions with the diffusions in the disordered regions have higher conductivity properties compared to the remaining ordered regions and are, therefore, more efficiently pumped electrically. As a result, disordered regions from alternating higher gain regions offset between regions of nondisordered waveguide regions having higher real index waveguiding properties but lower gain properties, thereby fulfilling the conditions necessary to provide fundamental or preferred $1^{st}$ supermode operation.

The active region of the phased array semiconductor laser of this invention may comprise a conventional active layer or an active region comprising a single quantum well or multiple quantum well.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
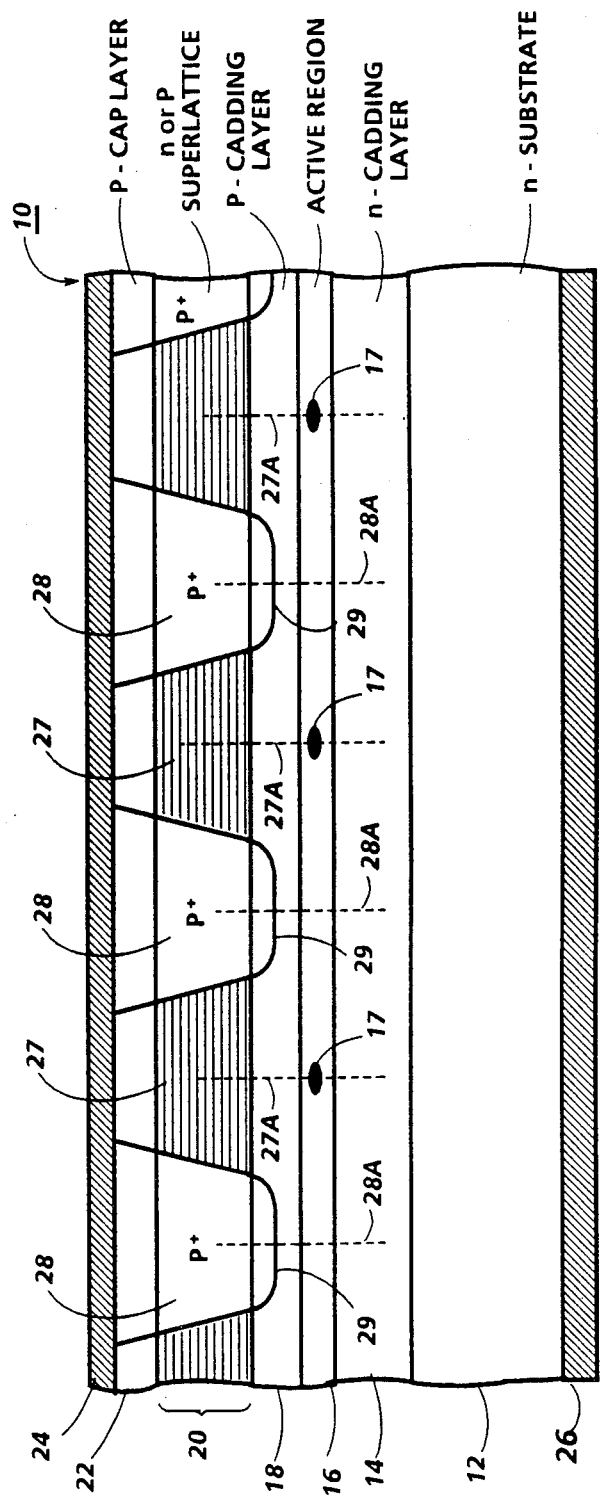
FIG. 1 schematically illustrates a side elevation of a first embodiment of the phased array semiconductor laser of this invention.
Figure 2:
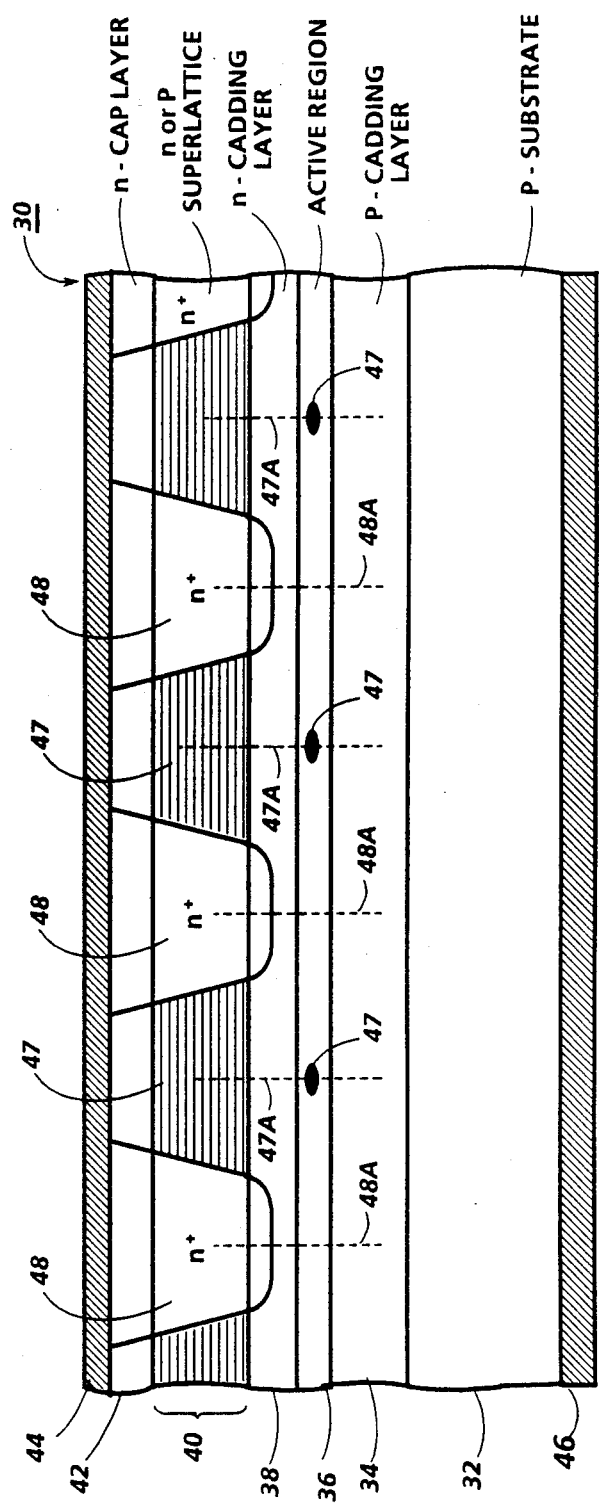
FIG. 2 schematically illustrates a side elevation of a second embodiment of the phased array semiconductor laser of this invention.

As a begining note, it should be realized that the semiconductor layers comprising the phase array semiconductor lasers 10 and 30 of FIGS. 1 and 2 are not shown to scale in order to illustrate the features of this invention.

Reference is now made to FIG. 1 wherein there is illustrated a first embodiment of the phased array semiconductor laser of this invention. Phase locked array laser 10 is illustrated in the III-V material regime of GaAs/GaAlAs. Laser 10 comprises a substrate 12 of n-GaAs upon which is epitaxially deposited a cladding layer 14 of n-Ga$_{1-x}$Al$_x$As; an active region 16 being undoped, or p-type or n-type and can comprise any active region structure commonly known in the art including, for example, a GaAs layer, for example, 50 nm to 500 nm thick, or a single quantum well of either GaAs or Ga$_{1-y}$Al$_y$As where y is very small and x>y or a multiple quantum well structure of alternating well layers of GaAs or Ga$_{1-y}$Al$_y$As and corresponding barrier layers of either AlAs or Ga$_{1-y'}$Al$_{y'}$As, or a separate single or multiple quantum well structure in a separate confinement cavity; a cladding layer 18 of p-Ga$_{1-z}$Al$_z$As where x, z>y; a multilayer n-type or p-type superlattice 20 comprising alternating well layers of GaAs or Ga$_{1-w'}$Al$_{w'}$As with barrier layers of either AlAs or Ga$_{1-w}$Al$_w$As or AlAs where x, z, w,>y', w'>y; and cap layer 22 of p+ GaAs. There may be a thin n-GaAs buffer layer deposited on substrate 12 prior to deposition of layers 14–22.

As an example of typical layer thicknesses, cladding layer 14 may be in the range of 0.5 to 1.0 μm and active region 16 may be a conventional double heterostructure having an active layer thickness of 50 nm to 500 nm thick or a quantum well structure wherein the quantum wells of GaAs may be about 3 nm–50 nm thick and the barrier layers of Ga$_{1-y}$Al$_y$As may be about 1 nm–10 nm thick with y in the range of 0.1 to 0.4. Cladding layer 18 may be in the range of 0.1 to 1.0 μm. Superlattice 20 may be in the range of 0.01 to 1.0 μm wherein the quantum wells of GaAs may be about 4 nm thick and the barrier layers of Ga$_{1-y}$Al$_y$As may be about 6 nm thick. Cap layer 22 may be in the range of 0.1 to 1.0 μm.

To form a multicavity array laser, impurity induced disordering (IID) techniques known in the art may be utilized, e.g. diffusion disordering or implant/anneal disordering. Diffusion disordering is exemplified in U.S. Pat. No. 4,378,255 to Holonyak wherein there is taught the technique of selectively disordering a multiple quantum well structure or superlattice in a semiconductor device through the employment of a zinc diffusion causing an upward shifting of the bandgap of the disordered material compared to regions of the multiple quantum well structure where disordering has not occurred. Such diffusions can be generally carried out in a temperature range of 500° C.–600° C., which is lower than the epigrowth temperature of III-V materials, which is about 750° C.

Such disordering is also possible with other elements such as Si, Ge and Sn but at higher temperatures, e.g., about 675° C.

Also, disordering is possible through implantation of elements acting as shallow or deep level impurities, such as, Se, Mg, Sn, O, S, Be, Te, Si, Mn, Zn, Cd, Ln, Cr or Kr followed by a high temperature anneal best performed in an As environment in the case of III-V epigrowth to prevent the outdiffusion of As from the growth. In the case of impurity implant followed by an anneal, the anneal temperatures are relatively at higher temperatures compared to diffusion temperatures, e.g. above 800° C.

It should be noted here that these types of disordering are not limited to species traditionally considered as impurities but also can be extended to include any species that either disorders the crystal through diffusion or damages the crystal, the annealing of the damaged crystal creating the disordered crystal.

In discussing the present invention, reference will be made to diffusion disordering. To form a multicavity array laser, a Si$_3$N$_4$ mask is formed on the top surface of layer 22 with openings exposing regions of the laser structure to impurity diffusion. The masks protect regions forming a series of laser optical cavities or elements having facet emission points 17 and that are sufficiently close to one another so as to provide optically coupled adjacent emitters, i.e., the evanescent wave of a neighboring optical cavity overlaps into adjacent optical cavities.

The current confinement means and desired refractive index profile are established by selectively diffusing a high concentration p impurity into the exposed regions of the laser structure. For example, zinc may be selectively diffused at 700° C. for a sufficient period of time in a semi-sealed graphite boat containing appropriate diffusion sources. This type of process would be typically carried out in a hydrogen flow. The diffusion of the superlattice 20 causes an intermixing of Al and Ga in the GaAs-GaAlAs superlattice resulting in a GaAlAs alloy of averaged AlAs mole fraction illustrated as IID regions 28 in FIG. 1. The diffusion of zinc is accomplished at a relatively low temperature, such as, 700° C. and is maintained only so long as to reach the depth of or penetrate cladding layer 18, as indicated at points 29. It is preferred not to extend the zinc diffusion across the laser active region because this extension of the diffusion region creates problems with parasitic p-n junctions in the laser structure and with free carrier absorption in the laser optical cavities.

Upon completion of the diffusion stop, conventional metal contacts 24 and 26 are applied respectively to the surface of cap layer 22 and bottom surface of substrate 12.

The array of zinc diffused regions 28 serve the dual function of smearing out or disordering the superlattice 20 to provide an index profile for guiding the propagation of radiation along the optical cavity of each laser element, represented by dotted line 27A, and also provides slightly more preferred current paths at regions 28 through the p-type disordered superlattice for current injection into active region 16 in the general regions depicted by dotted line 27A. Due to the lower index profile provided by IID regions 28, the structure encourages operation of the array of lasers with a single lobe far field pattern. Also, due to the n-type layers chosen for superlattice 20, current injection is more confined to zinc diffused p-type layers of regions 28. The resulting laser structure in the plane of superlattice 20 is such that a plurality of higher index guiding regions are provided in the nondisordered areas of superlattice 20. These regions provide for enhanced waveguiding due to a higher refractive index compared to regions 28. On the other hand, regions 28 provide areas of higher conductivity or less resistance to current flow, vis a vis nondisordered regions 27 so that with the application of a voltage across metal contacts 24 and 26, current flow will be substantially confined to and through IID regions 28. Current will also flow through region 27A due to the lateral diffusion of carriers.

The result achieved is that the regions depicted by dotted line 28A will be of higher gain compared to that obtained at the optical cavity regions depicted by dotted line 27A so that spatial modulation of the optical overlap of the optical field of each of the laser elements is achieved across the array thereby favoring the fundamental or first order supermode over other potential modes of the multi-element array laser 10. As can be determined by a review of the prior art previously cited, the structure of laser 10 achieves the results of those structures with a simpler and easier to fabricate array laser structure, which provides a higher single mode output power capability as well as improved optical field mode control through the use of IID techniques. For example, some array laser structures of the prior art require a proton bombardment definition for current confinement means, which is not necessary relative to the laser structures of this invention.

It should be noted that a virtually symmetric waveguiding structure may be maintained at regions depicted by dotted line 27A by designing individual compositional components of the p side cladding region comprising cladding layer 18 and superlattice 20 to have a combined refractive index at regions 27 and 27A to have a substantially identical refractive index as n side cladding layer 14.

A superlattice may likewise be formed in the bottom or n side cladding layer 14 either alone or in combination with p side clad superlattice 20. As a superlattice cladding combination, a full length optical cavity index guide would be established.

In FIG. 2, array laser 30 is of identical structure to array laser 10, except that the impurity type of the respective semiconductor layers comprising the laser structure are reversed. Laser 30 comprises a substrate 32 of p-GaAs upon which is epitaxially deposited a cladding layer 34 of p-Ga$_{1-x}$Al$_x$As; an active region 36 being undoped or p-type or n-type and can comprise any active region structure commonly known in the art as previously exemplified in FIG. 1 relative to region 16; a cladding layer 38 of n-Ga$_{1-z}$Al$_z$As where x, z>y, multilayer n or p type superlattice 40 comprising alternating well layers of materials previously exemplified in FIG. 1 relative to superlattice 20; and a cap layer of n+GaAs.

The example of layer thickness for the structure layers of laser 30 may be in the ranges exemplified for the corresponding layers of laser 10.

To form a multicavity array laser, a Si$_3$N$_4$ mask is formed on the top regions of layer 42 with openings exposing regions of the laser structure to IID techniques as previously explained. A series of laser elements with emission points 47 are formed that are sufficiently close to one another so as to provide optically coupled adjacet emitters, i.e., the evanescent wave of a neighboring optical cavity overlaps into adjacent optical cavities. The establishment of the current confinement means and refractive index profile are established in the manner previously explained, except an n-type diffusant, e.g., silicon, tin or germanium, is utilized to efficiently disorder the superlattice structures in regions 38 to a depth into cladding layer 38 not to penetrate the active region 36 forming optical guide regions 47A.

Upon completion of the diffusion step, conventional metal contacts 44 and 46 are applied respectively to the surface of cap layer 42 and bottom surface of substrate 32.

The array of silicon diffused regions 48 serve the dual function of smearing out or disordering the superlattice 40 to provide an index profile for guiding the propagation of radiation along the optical cavity of each laser element, represented by dotted line 47A, and also provides slightly more preferred current paths at regions 48 through the n-type disordered superlattice for current injection into active region 36 in the general regions depicted by dotted line 47A. Due to the lower index profile provided by IID regions 48, the structure encourages operation of the array of lasers with a single lobe far field pattern. Also, due to the p-type lasers chosen for superlattice 40, current injection is more confined to silicon diffused n-type layers of regions 48. The resulting laser structure in the plane of superlattice 40 is such that a plurality of higher index guiding regions 47 are provided in the nondisordered areas of superlattice 40. These regions provide for enhanced waveguiding due to a higher refractive index compared to regions 48. On the other hand, regions 48 provide areas of higher conductivity or less resistance to current flow, vis a vis nondisordered regions 47 so that with the application of a voltage across metal contacts 44 and 46, current flow will be substantially confined to and through IID regions 48. Current will also flow through region 47A due to the lateral diffusion of carriers.

Higher gain will therefore be experienced in regions indicated by dotted lines 48A compared to gain achieved in optical cavity regions depicted by dotted lines 27A so that spatial modulation of the optical overlap of the optical field of each of the laser elements is achieved across the array thereby favoring the fundamental or first order supermode over other potential modes of the multi-element array laser 30.

A superlattice may likewise be formed in the bottom or p side cladding layer 34 either alone or in combination with n-side clad superlattice 40. As a superlattice cladding combination, a full length optical cavity index guide would be established.

In connection with the embodiments of both FIGS. 1 and 2, it will be evident to those skilled in the art that in the illustration for laser 10 in FIG. 1, the p+ type diffused regions 28 may be n+ type diffused regions, e.g. silicon, so long as the background doping of superlattice 20 is p type. By the same token, for laser 30 in FIG. 2, the n+ type diffused regions 48 may be p+ type diffused regions, e.g. zinc, so long as the background doping of superlattice 40 is n type.

Although the geometries illustrated in FIGS. 1 and 2 are planar structures, it will be evident to those skilled in the art that the inpurity induced disordering regions provided in those structures may also be utilized in nonplanar laser geometries as well.

Although all the foregoing embodiments have been described in connection with semiconductors of the GaAs and GaAlAs regime, other light emitting materials may be employed, such as InGaAsP, GaAlAsP, InGaAlP, InGaAlAsP, GaAlSb and appropriate II-VI materials, such as ZnSe/ZnSSe. Further, as indicated in each embodiment illustrated, the active region may comprise a single active layer or, alternatively, may comprise an active region of either single quantum well or multiquantum well.

Figure 3:
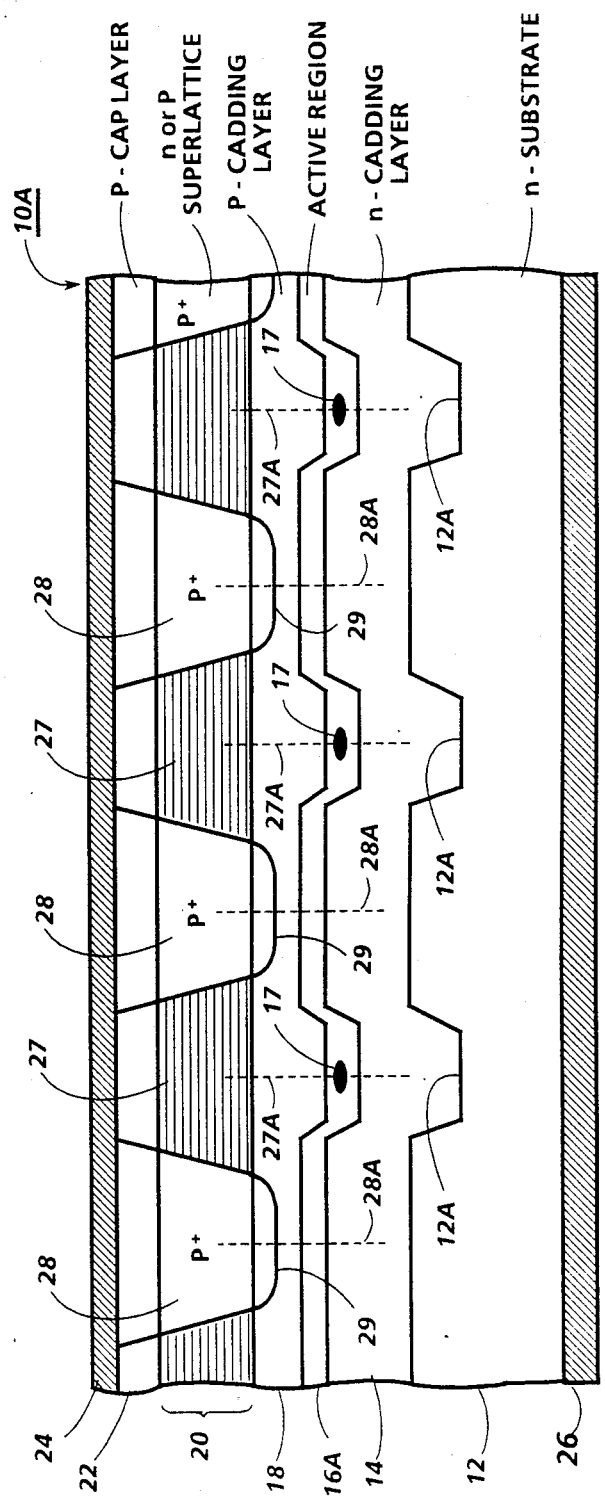
FIG. 3 schematically illustrates a side elevation of the first embodiment of the phased array semiconductor laser of this invention with a nonplanar active region.

Also, the active region 16 may be nonplanar, as illustrated in FIG. 3. Array laser 10A of FIG. 3 is identical to array laser 10 of FIG. 1 except that substrate 12 has been provided, prior to growth, with a plurality of channels or grooves 12A so that, upon subsequent growth of layers 14-16, active region 16A will be nonplanar, as illustrated in FIG. 3. Such an active region structure is well known in the art.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. In a phased array semiconductor laser comprising a series of lasing elements formed in a plurality of semiconductor layers including an active region formed between a pair of cladding layers for providing light wave generation and propagation under lasing conditions, said elements each comprising an optical guide region for optical field containment of said propagating light and wherein the optical field of each of said lasing elements are coupled to provide a phase locked condition across the array, the improvement comprising a disorderable structural means formed in at least one of said cladding layers, regions of said disorderable cladding layer adjacent to said optical guide regions subjected to impurity induced disordering to form said optical guide regions and to produce therein higher gain compared to the gain experienced in said optical guide regions to thereby spatially modulate the current distribution across said array so that the integral of the gain of the optical field present in said active region of said laser is higher in said adjacent disordered regions compared to said optical guide regions.

2. The phased array semiconductor laser of claim 1 wherein said impurity induced disordering comprises an impurity diffusion.

3. The phased array semiconductor laser of claim 1 wherein said impurity induced disordering comprises an implant/anneal technique.

4. The phased array semiconductor laser of claim 1 wherein said disorderable region comprises a superlattice structure, said optical guide regions including said superlattice structure not disordered by said impurity induced disordering and said adjacent disordered regions including said superlattice structure disordered by said impurity induced disordering.

5. The phased array semiconductor laser of claim 1 wherein said active region is a single active layer.

6. The phased array semiconductor laser of claim 5 wherein said active region is planar.

7. The phased array semiconductor laser of claim 5 wherein said active region is nonplanar.

8. The phased array semiconductor laser of claim 1 wherein said active region is a single quantum well.

9. The phased array semiconductor laser of claim 8 wherein said active region is planar.

10. The phased array semiconductor laser of claim 8 wherein said active region is nonplanar.

11. The phased array semiconductor laser of claim 1 wherein said active region is a multiple quantum well.

12. The phased array semiconductor laser of claim 11 wherein said active region is planar.

13. The phased array semiconductor laser of claim 11 wherein said active region is nonplanar.

14. The phased array semiconductor laser of claim 1 wherein said active region is a separate quantum well structure in a separate confinement cavity.

15. The phased array semiconductor laser of claim 14 wherein said active region is planar.

16. The phased array semiconductor laser of claim 14 wherein said active region is nonplanar.

* * * * *